United States Patent
Nishimura et al.

(10) Patent No.: US 10,224,896 B2
(45) Date of Patent: Mar. 5, 2019

(54) PIEZOELECTRIC VIBRATOR AND PIEZOELECTRIC VIBRATION DEVICE

(71) Applicant: Murata Manufacturing Co., Ltd., Nagaokakyo-shi, Kyoto-fu (JP)

(72) Inventors: Toshio Nishimura, Nagaokakyo (JP); Keiichi Umeda, Nagaokakyo (JP); Ville Kaajakari, Altadena, CA (US)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 475 days.

(21) Appl. No.: 15/211,055

(22) Filed: Jul. 15, 2016

(65) Prior Publication Data

US 2016/0329877 A1 Nov. 10, 2016

Related U.S. Application Data

(63) Continuation of application No. PCT/JP2015/050988, filed on Jan. 15, 2015.
(Continued)

(51) Int. Cl.
*H03H 9/125* (2006.01)
*H01L 41/04* (2006.01)
(Continued)

(52) U.S. Cl.
CPC ...... *H03H 9/02244* (2013.01); *H03H 9/0595* (2013.01); *H03H 9/125* (2013.01); *H03H 9/2489* (2013.01); *H03H 2009/155* (2013.01)

(58) Field of Classification Search
CPC . H03H 9/02244; H03H 9/125; G01C 19/5607
See application file for complete search history.

(56) References Cited

U.S. PATENT DOCUMENTS

| 5,451,828 A | 9/1995 | Tomikawa et al. |
| 7,561,010 B2 | 7/2009 | Hikita et al. |
| (Continued) | | |

FOREIGN PATENT DOCUMENTS

| JP | H0783671 A | 3/1995 |
| JP | 2002076822 A | 3/2002 |
| (Continued) | | |

OTHER PUBLICATIONS

International Search Report issued for PCT/JP2015/050988, dated Mar. 31, 2015.
(Continued)

*Primary Examiner* — J. San Martin
(74) *Attorney, Agent, or Firm* — Arent Fox LLP

(57) ABSTRACT

A piezoelectric vibrator that includes first and second vibration portions that vibrate with mutually reverse phases. Each of the vibration portions includes a silicon layer, a first piezoelectric layer and a second piezoelectric layer that has polarization in an opposite direction to a direction of polarization of the first piezoelectric layer. First and second electrodes are disposed on opposite sides of the second piezoelectric layer. The piezoelectric vibrator has a structure such that a first potential is applied to the first electrode of the first vibration portion and the second electrode of the second vibration portion, and a second potential is applied to the second electrode of the first vibration portion and the first electrode of the second vibration portion.

20 Claims, 14 Drawing Sheets

Related U.S. Application Data

(60) Provisional application No. 61/931,160, filed on Jan. 24, 2014.

(51) Int. Cl.
    *H03H 9/02*     (2006.01)
    *H03H 9/24*     (2006.01)
    *H03H 9/05*     (2006.01)
    *H03H 9/15*     (2006.01)

(56) References Cited

U.S. PATENT DOCUMENTS

| | | |
|---|---|---|
| 7,737,807 B2 | 6/2010 | Larson, III et al. |
| 8,098,002 B2 | 1/2012 | Baborowski et al. |
| 2006/0158283 A1 | 7/2006 | Hikita et al. |
| 2007/0086080 A1 | 4/2007 | Larson, III et al. |
| 2010/0013360 A1 | 1/2010 | Baborowski et al. |

FOREIGN PATENT DOCUMENTS

| | | | |
|---|---|---|---|
| JP | 2006203304 A | 8/2006 | |
| JP | 2007036915 A | 2/2007 | |
| JP | 2007116699 A | 5/2007 | |
| JP | 2010206821 A | 9/2010 | |
| JP | 2012065293 A | 3/2012 | |
| WO | WO 2008043727 A1 | 4/2008 | |
| WO | WO-2014185281 A1 * | 11/2014 | ............... H03H 9/21 |

OTHER PUBLICATIONS

Written Opinion of the International Searching Authority issued for PCT/JP2015/050988, dated Mar. 31, 2015.

* cited by examiner

| | FREQUENCY (kHz) | C0 [pF] | C1 [fF] | R1 [kΩ] | k²Q |
|---|---|---|---|---|---|
| PRESENT EMBODIMENT | 38.53 | 3.05 | 13.25 | 61.66 | 20.1 |
| PARALLEL CONNECTION | 33.52 | 2.68 | 10.02 | 114.04 | 14.4 |
| SERIES CONNECTION | 33.52 | 0.61 | 2.54 | 450.20 | 15.8 |

|  | FREQUENCY (kHz) | C0 [pF] | C1 [fF] | R1 [kΩ] | $k^2Q$ |
|---|---|---|---|---|---|
| PRESENT EMBODIMENT | 73.58 | 3.32 | 16.38 | 24.66 | 24.3 |
| PARALLEL CONNECTION | 73.14 | 2.39 | 9.34 | 47.67 | 17.7 |
| SERIES CONNECTION | 73.07 | 0.56 | 2.04 | 178.43 | 20.2 |

PRIOR ART

PIEZOELECTRIC VIBRATOR AND PIEZOELECTRIC VIBRATION DEVICE

CROSS REFERENCE TO RELATED APPLICATIONS

The present application is a continuation of PCT/JP2015/050988 filed Jan. 15, 2015, which claims priority to U.S. Patent Provisional Application No. 61/931,160, filed Jan. 24, 2014, the entire contents of each of which are incorporated herein by reference.

FIELD OF THE INVENTION

The present disclosure relates to piezoelectric vibrators and piezoelectric vibration devices.

BACKGROUND OF THE INVENTION

Piezoelectric vibrators are used as a device to implement a timer function in electronic apparatuses. As electronic apparatuses become smaller in size, piezoelectric vibrators are required to be smaller in size as well. As such, a piezoelectric vibrator manufactured by using the MEMS (Micro Electro Mechanical Systems) technique (hereinafter, referred to as "MEMS vibrator") is drawing attention today.

As a MEMS vibrator, there exists a configuration in which one vibrator and another vibrator are made to vibrate with mutually reverse phases. For example, Patent Document 1 discloses a MEMS vibrator having three vibration arms. In the stated MEMS vibrator, a vibration arm in the center and two vibration arms in the outer side portions perform bending vibrations with mutually reverse phases by causing a direction of an electric field applied to the vibration arm in the center and a direction of an electric field applied to the two vibration arms in the outer side portions to be opposite to each other.

Patent Document 1: International Publication No. WO 2008/043727.

For typical configurations in which directions of electric fields applied to vibration portions are opposite to each other, there exists a parallel connection configuration and a series connection configuration. FIG. 18 is a diagram illustrating an example of electric connection in a parallel connection configuration. Meanwhile, FIG. 19 is a diagram illustrating an example of electric connection in a series connection. For a typical configuration of a MEMS vibrator, three or more vibration arms are included in the configuration, as disclosed in Patent Document 1. However, in FIGS. 18 and 19, in order to simplify the explanation, only two vibration arms are illustrated. It is noted that FIGS. 18 and 19 are diagrams each illustrating an electrical connection relationship among a silicon layer, an upper electrode, a lower electrode, an insulation layer, and a piezoelectric layer in the two vibration arms, and that they are not actual cross-sectional views.

First, the parallel connection configuration will be described. As shown in FIG. 18, a MEMS vibrator 1800 includes a silicon layer 1810, an insulation layer 1811, and vibration arms 1812 and 1813. The vibration arm 1812 includes an upper electrode 1820, a lower electrode 1821, and a piezoelectric layer 1822. Likewise, the vibration arm 1813 includes an upper electrode 1830, a lower electrode 1831, and a piezoelectric layer 1832. A potential of each electrode is controlled so that the direction of an electric field applied to the vibration arm 1812 and the direction of an electric field applied to the vibration arm 1813 are opposite to each other. In this parallel connection configuration, combined capacitance Cf of the MEMS vibrator 1800 equals the sum of electrostatic capacity Ca1 of the vibration arm 1812 and electrostatic capacity Ca2 of the vibration arm 1813 (Cf=Ca1+Ca2). As such, this configuration has an advantage that the combined capacitance Cf can be made large.

It is noted that in the parallel connection configuration, a potential of the lower electrode 1821 of the vibration arm 1812 and a potential of the lower electrode 1831 of the vibration arm 1813 are different. Because resistivity of the silicon layer 1810 is low, the lower electrodes 1821 and 1831 are short-circuited if they are directly disposed on the silicon layer 1810. As such, the insulation layer 1811 is provided between the silicon layer 1810 and the lower electrodes 1821, 1831. This causes degradation in characteristics in some case because of generation of stray capacitance Cs formed with stray capacitance Cb1 between the lower electrode 1821 and the silicon layer 1810 and stray capacitance Cb2 between the lower electrode 1831 and the silicon layer 1810 (Cs=1/(1/Cb1+1/Cb2)).

Next, the series connection configuration will be described. As shown in FIG. 19, a MEMS vibrator 1900 includes the silicon layer 1810 and the vibration arms 1812 and 1813. A potential of each electrode is controlled so that the direction of an electric field applied to the vibration arm 1812 and the direction of an electric field applied to the vibration arm 1813 are opposite to each other. In the configuration shown in FIG. 19, the lower electrode 1821 of the vibration arm 1812 and the lower electrode 1831 of the vibration arm 1813 are floating electrodes and have the same potential. Accordingly, unlike the MEMS vibrator 1800 shown in FIG. 18, it is unnecessary to provide the insulation layer 1811, thereby receiving no influence of the stray capacitance Cs. Note that, however, combined capacitance Cf (=1/(1/Ca1+1/Ca2)) of the MEMS vibrator 1900 is smaller than that of the parallel connection configuration. This increases resonant impedance and causes degradation in characteristics in some case.

SUMMARY OF THE INVENTION

The present invention considers the above problems, and an object of the disclosed vibrators is to make the electrostatic capacity relatively large and suppress the influence of stray capacitance in a piezoelectric vibrator.

A piezoelectric vibrator according to an exemplary aspect is a piezoelectric vibrator including a first vibration member and a second vibration member that vibrate with mutually reverse phases. In the stated piezoelectric vibrator, each of the first and second vibration members includes a silicon layer, a first piezoelectric layer disposed on the silicon layer, a first electrode disposed on the first piezoelectric layer, a second piezoelectric layer that is disposed on the first electrode and has polarization in an opposite direction to a direction of polarization of the first piezoelectric layer, and a second electrode disposed on the second piezoelectric layer. The piezoelectric vibrator is configured such that a first potential is applied to the first electrode of the first vibration portion and the second electrode of the second vibration portion, and a second potential is applied to the second electrode of the first vibration portion and the first electrode of the second vibration portion.

According to the piezoelectric vibrator disclosed herein, it is possible to make the electrostatic capacity relatively large and suppress the influence of stray capacitance.

DETAILED DESCRIPTION OF THE EMBODIMENTS

Figure 1:
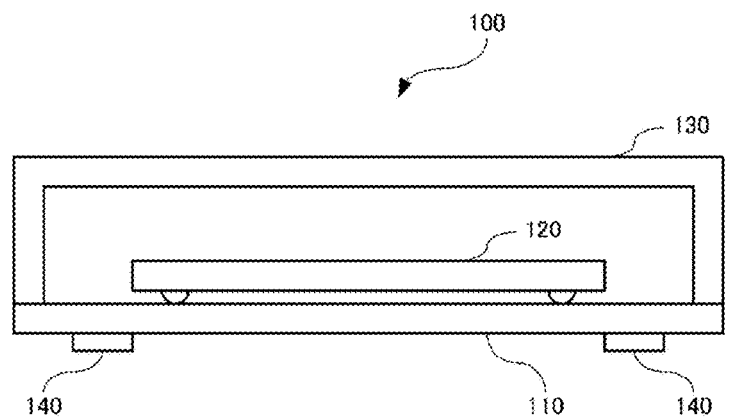
FIG. 1 is a diagram illustrating an example of a schematic structure of a piezoelectric vibration device according to an embodiment of the present invention.

Hereinafter, an embodiment of the present invention will be described with reference to the drawings. FIG. 1 is a diagram illustrating an example of a schematic structure of a piezoelectric vibration device according to an embodiment of the present invention. As shown in FIG. 1, a piezoelectric vibration device 100 is a piezoelectric vibration device including a substrate 110, a piezoelectric vibrator 120, a cover 130, and an outer electrode. The piezoelectric vibrator 120 is a MEMS vibrator manufactured by using the MEMS technique. The cover 130 is formed with silicon, for example, and covers the piezoelectric vibrator 120. The outer electrode 140 is a metal electrode for electrically connecting a device outside the piezoelectric vibration device 100 to the piezoelectric vibrator 120. In the following, an illustrative embodiment of the piezoelectric vibrator 120 will be described.

Figure 2:
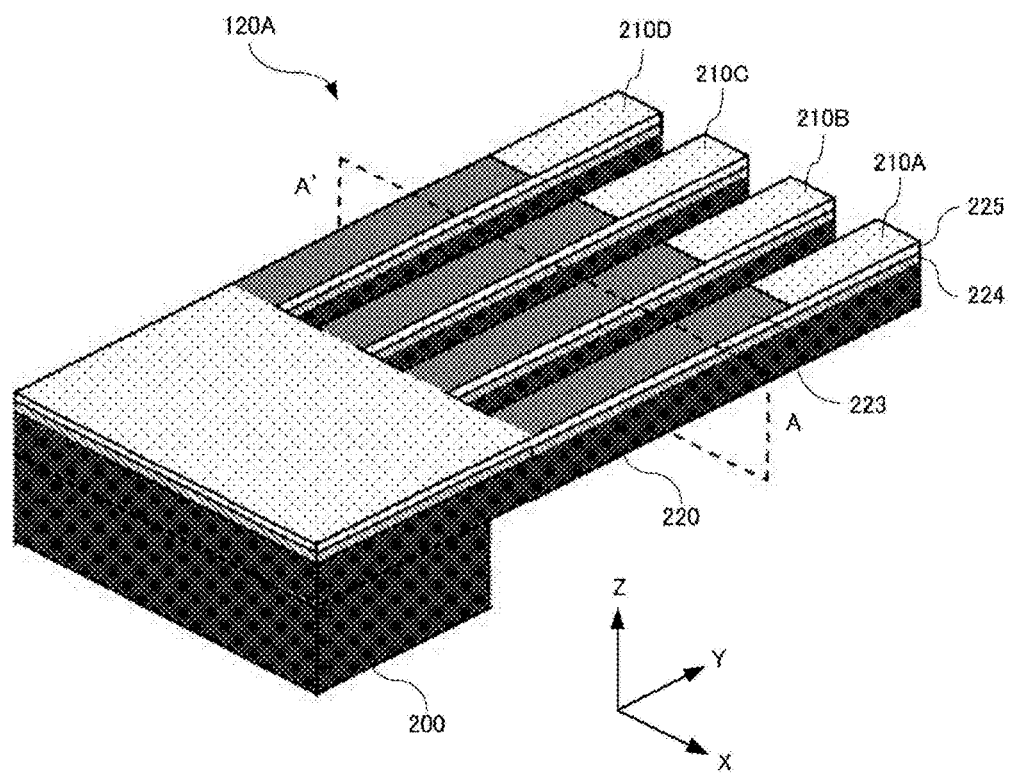
FIG. 2 is a diagram illustrating a configuration example of a piezoelectric vibrator.
Figure 3:
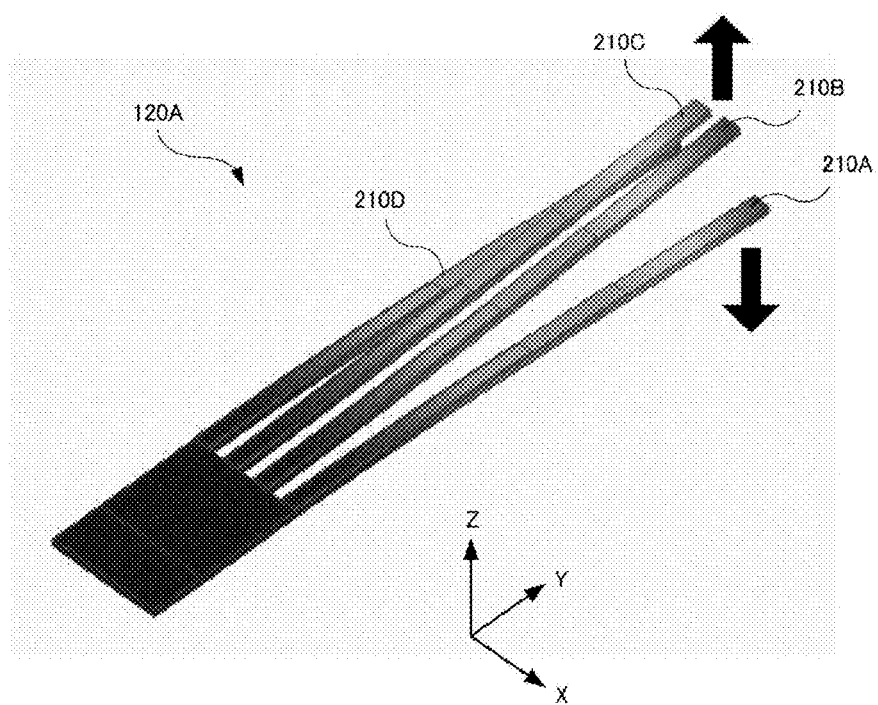
FIG. 3 is a diagram illustrating an example of a state of bending vibration of a piezoelectric vibrator.

FIG. 2 is a diagram illustrating a configuration example of the piezoelectric vibrator 120. A piezoelectric vibrator 120A includes a holding or support structure 200 and vibration arms 210 (210A through 210D). The holding structure 200 is formed with silicon, for example. Each of the vibration arms 210 is a rectangular vibration "portion" or "member" (the terms "portion" and "member" are used interchangeably) that extends from the holding structure 200 in a predetermined direction (Y axis direction in FIG. 2) and performs bending vibration in a vertical direction (Z axis direction in FIG. 2) relative to a plane including the vibration arms 210A through 210D (XY plane in FIG. 2). In order to suppress generation of torsional moment in the holding structure 200 due to the vibrations of the vibration arms 210A through 210D, two vibration arms 210B, 210C at the center side and two vibration arms 210A, 210D in the outer side portions vibrate with mutually reverse phases, as shown in FIG. 3. It should be appreciated that the number of vibration arms is not limited to four, and other number of arms can be employed as needed.

Figure 4:
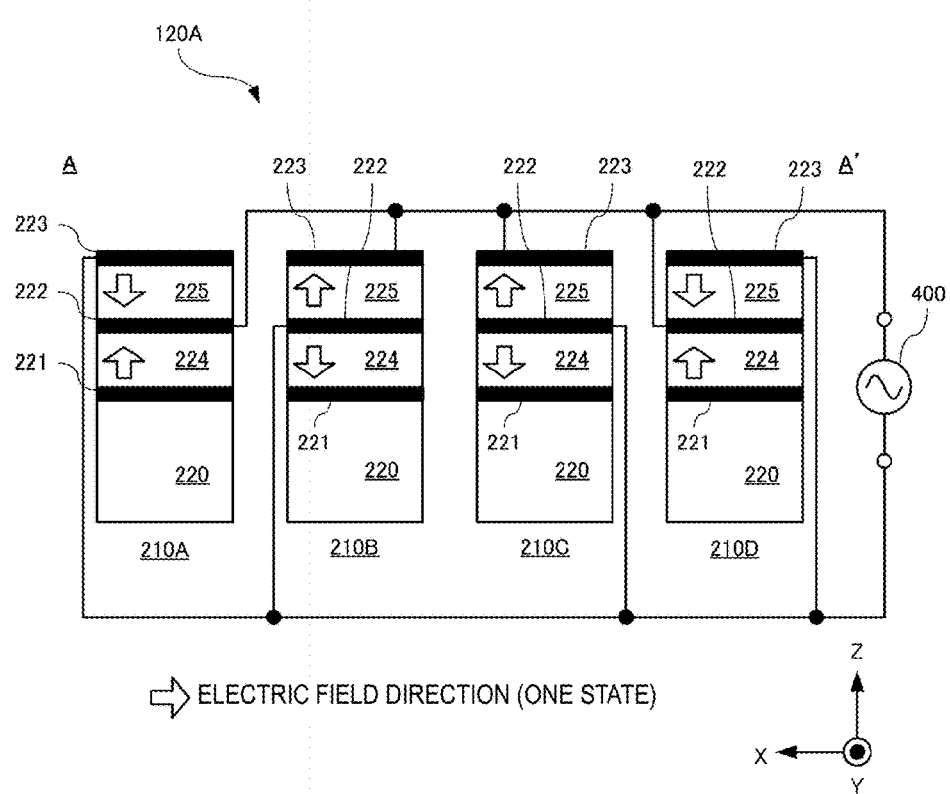
FIG. 4 is a diagram illustrating an example of electric connection in an A-A' cross section shown in FIG. 2.

FIG. 4 is a diagram illustrating an example of electric connection in an A-A' cross section shown in FIG. 2. With reference to FIGS. 2 and 4, an example of the configuration of the vibration arms 210 will be described. The vibration arms 210 each include a silicon layer 220, electrodes 221 through 223, and piezoelectric layers 224 and 225.

According to an exemplary embodiment, the silicon layer 220 can contain, for example, phosphorus (P), arsenic (As), antimony (Sb), or the like as an n-type dopant (donor). The silicon layer 220 may be the one containing a p-type dopant (acceptor).

The electrodes 221 through 223 are metal electrodes, and are formed preferably with molybdenum, for example. The electrode 222 (first electrode) and the electrode 223 (second electrode) are electrically connected to an AC power supply 400 provided outside the piezoelectric vibrator 120A. The electrode 221 (third electrode) is a floating electrode, to which a potential is not applied. The electrodes 221 of the vibration arms 210A through 210D may be electrically connected with each other through a region of each vibration arm on the holder side, for example. Likewise, in other configurations to be explained below, all the electrodes 221 may be electrically connected with each other.

The piezoelectric layer 224 (first piezoelectric layer) is a piezoelectric thin film to convert an applied voltage to vibrations, and may contain aluminum nitride as a main ingredient, for example. Specifically, the piezoelectric layer 224 may be formed with, for example, aluminum scandium nitride (ScAlN). ScAlN is a material in which part of aluminum (Al) in aluminum nitride (AlN) is replaced with scandium (Sc). With regard to ScAlN used for the piezoelectric layer 224, in the case where an atomic percentage is defined to be 100 atm % when the number of Al atoms and the number of Sc atoms are summed, the stated ScAlN can be the one in which Al is replaced with Sc to make Sc approximately 40 atm %, for example. The piezoelectric layer 224 expands/contracts in accordance with a voltage between the electrodes 221 and 222 in an in-plane direction (Y axis direction) of a plane including the vibration arms 210A through 210D (XY plane). With the expansion/contraction of the piezoelectric layer 224, the vibration arm 210 exhibits bending displacement in the vertical direction (Z axis direction) relative to the XY plane.

According to the exemplary embodiment, the piezoelectric layer 225 (second piezoelectric layer) has the same configuration as the piezoelectric layer 224 except that its polarization direction is opposite to that of the piezoelectric layer 224.

In the piezoelectric vibrator 120A, the polarization directions of the piezoelectric layers 224 and 225 are opposite to each other, and the direction of an electric field applied to the piezoelectric layer 224 and the direction of an electric field applied to the piezoelectric layer 225 are reversed every vibration arm. Specifically, as shown in FIG. 4, for example, when a positive potential is applied to the electrode 223 and a negative potential is applied to the electrode 222 in the vibration arm 210A (first vibration arm), the direction of an electric field applied to the piezoelectric layer 225 is downward in FIG. 4. At this time, in the vibration arm 210B (second vibration arm), since a positive potential is applied to the electrode 222 and a negative potential is applied to the electrode 223, the direction of an electric field applied to the piezoelectric layer 225 is upward in FIG. 4. Here, the electrode 221 of the vibration arm 210A and the electrode 221 of the vibration arm 210B are at the same potential by being electrically connected in a direct manner or electrically connected in the holding structure 200 in an indirect manner through the common silicon layer 220. With this, when a negative potential is applied to the electrode 222 of the vibration arm 210A and a positive potential is applied to the electrode 222 of the vibration arm 210B, the direction of an electric field applied to the piezoelectric layer 224 of the vibration arm 210A is upward in FIG. 4 while the direction of an electric field applied to the piezoelectric layer 224 of the vibration arm 210B is downward in FIG. 4. Because of this, displacement directions of the piezoelectric layers 224 and 225 in each vibration arm are the same, and the vibration arm 210A and the vibration arm 210B are displaced in opposite directions to each other.

Because the potentials are applied to the vibration arm 210A in the same manner as the vibration arm 210D and the potentials are applied to the vibration arm 210B in the same manner as the vibration arm 210C, the vibration arms 210A, 210D and the vibration arms 210B, 210C of the piezoelectric vibrator 120A vibrate in accordance with the AC power supply 400 in an up-down direction (Z axis direction) with mutually reverse phases, as shown in FIG. 3.

Figures 5, 6:
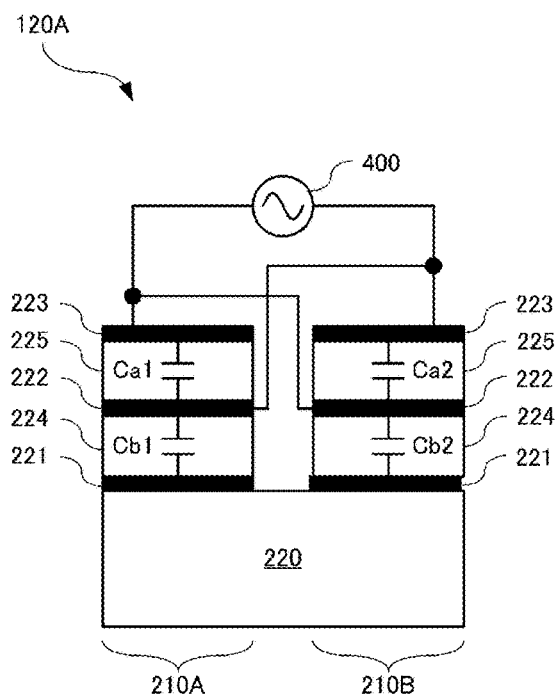
FIG. 5 is a diagram illustrating only two vibration arms in order to explain a difference in characteristics from typical configurations.
FIG. 6 is a simulation result indicating characteristics of a piezoelectric vibrator.

FIG. 5 is a diagram illustrating only two vibration arms 210A and 210B in order to explain a difference in characteristics from typical configurations. It is noted that FIG. 5 is, like FIGS. 18 and 19, a diagram indicating an electric connection relationship among a silicon layer, an upper electrode, a lower electrode, an insulation layer, and a piezoelectric layer in the two vibration arms, and that it is not an actual cross-sectional view. As shown in FIG. 5, in the piezoelectric vibrator 120A, the piezoelectric layers 225 are connected in parallel, while the piezoelectric layers 224 are connected in series. Therefore, combined capacitance Cf of the vibration arms 210A and 210B is obtained by a formula of Ca1+Ca2+(1/(1/Cb1+1/Cb2)), where "Ca1" is electrostatic capacity between the electrodes 222 and 223 of the vibration arm 210A, "Ca2" is electrostatic capacity between the electrodes 222 and 223 of the vibration arm 210B, "Cb1" is electrostatic capacity between the electrodes 221 and 222 of the vibration arm 210A, and "Cb2" is electrostatic capacity between the electrodes 221 and 222 of the vibration arm 210B.

Figure 18:
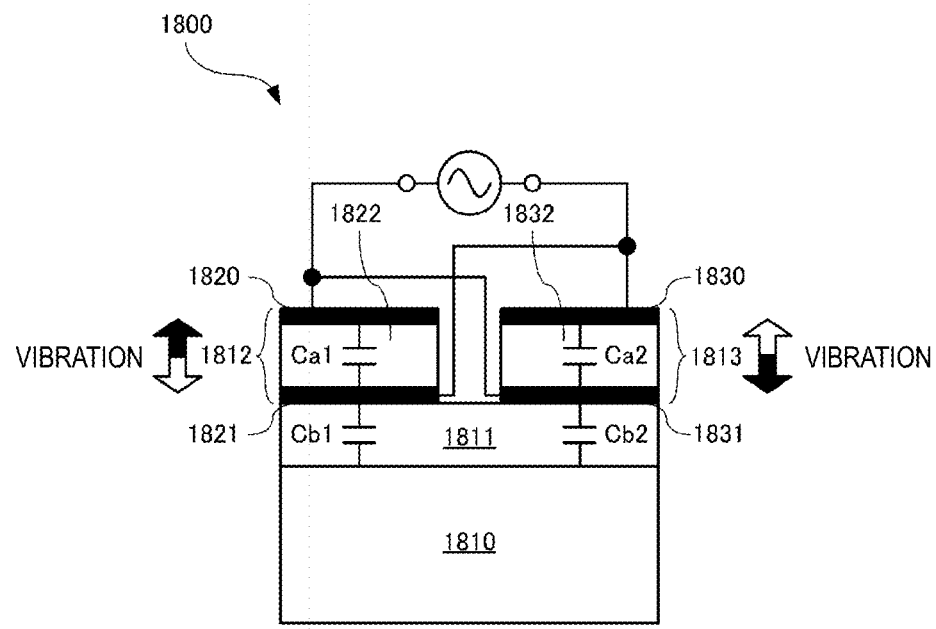
FIG. 18 is a diagram illustrating an example of electric connection in a parallel connection configuration.
Figure 19:
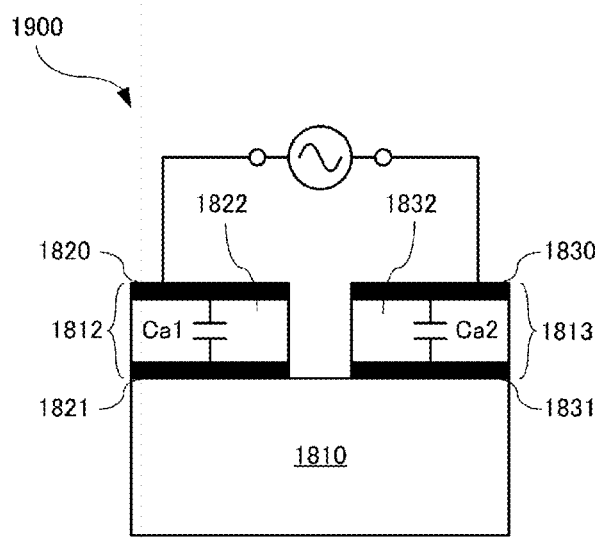
FIG. 19 is a diagram illustrating an example of electric connection in a series connection.

As discussed above, in the piezoelectric vibrator 120A, the electrostatic capacity can be large in comparison with the typical configurations as shown in FIGS. 18 and 19. Further, in the piezoelectric vibrator 120A, because the electrodes 221 of the vibration arms 210 are at the same potential (floating potential), it is unnecessary to provide an insulation layer between the silicon layer 220 and the electrode 221. Accordingly, no stray capacitance will be generated between the silicon layer 220 and the electrode 221. This makes it possible to make the electrostatic capacity relatively large and suppress the influence of stray capacitance in comparison with the typical configurations.

Figure 7:
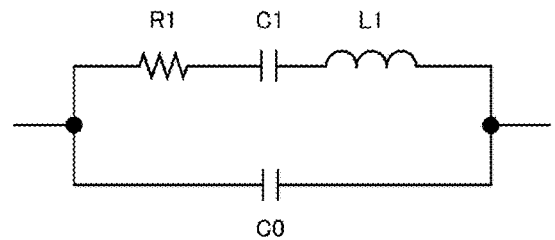
FIG. 7 is an equivalent circuit diagram of a piezoelectric vibrator.

FIG. 6 is a simulation result indicating characteristics of a piezoelectric vibrator. In FIG. 6, items specified by "present embodiment" indicate characteristics of the piezoelectric vibrator 120A. Further, in FIG. 6, items specified by "parallel connection" indicate characteristics of a piezoelectric vibrator adopting a typical parallel connection. Furthermore, in FIG. 6, items specified by "series connection" indicate characteristics of a piezoelectric vibrator adopting a typical series connection. Note that "C0", "C1", and "R1" shown in FIG. 6 represent values of respective circuit elements when the piezoelectric vibrator is expressed in an equivalent circuit diagram as shown in FIG. 7.

As shown in FIG. 6, in the piezoelectric vibrator 120A, electrostatic capacity C0 has a larger value than the typical configurations. Further, in the piezoelectric vibrator 120A, "$k^2Q$" representing vibration performance also has a larger value than the typical configurations. That is to say, it should also be understood from the simulation result that the piezoelectric vibrator 120A has more preferable characteristics than the typical configurations.

Figure 8:
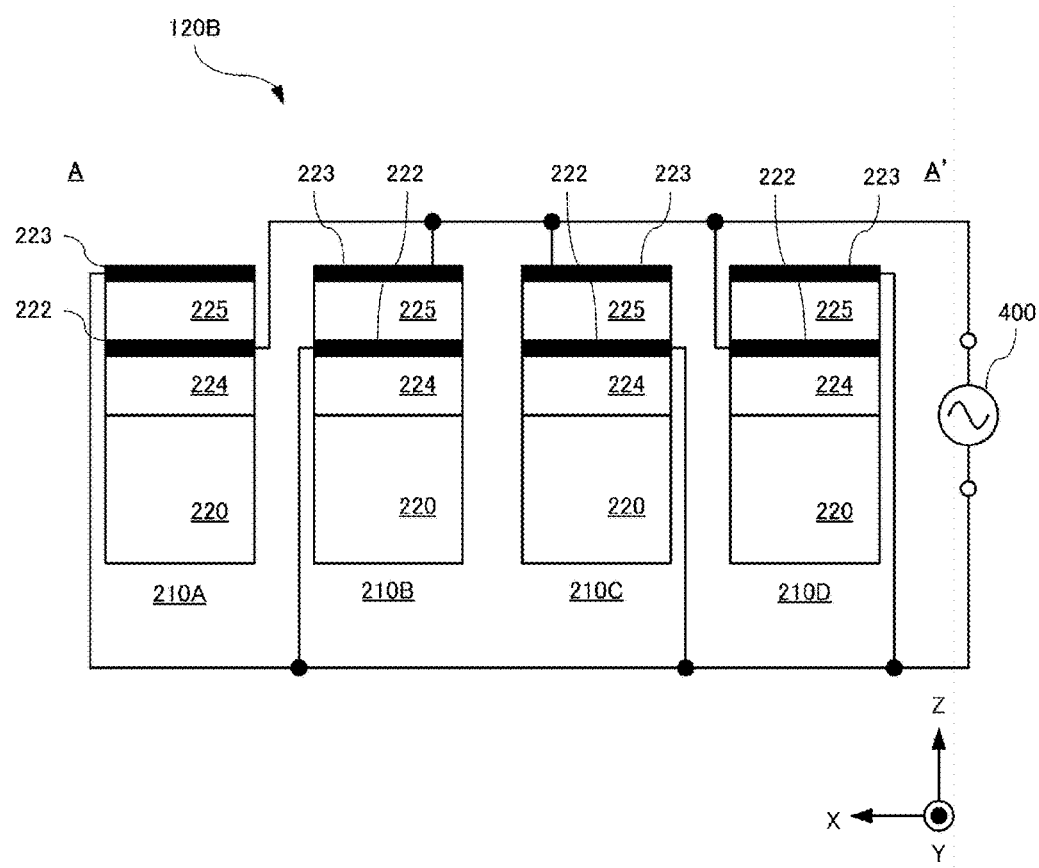
FIG. 8 is a diagram illustrating another configuration example of a piezoelectric vibrator.

FIG. 8 is a diagram illustrating another configuration example of the piezoelectric vibrator 120. It is noted that identical elements to those of the piezoelectric vibrator 120A shown in FIGS. 2 and 4 are assigned the same reference signs, and descriptions thereof will be omitted. As shown in FIG. 8, a piezoelectric vibrator 120B has the same configuration as the piezoelectric vibrator 120A except that the electrode 221, which is included in the piezoelectric vibrator 120A, is not included in the piezoelectric vibrator 120B. In the piezoelectric vibrator 120B, the silicon layer 220, which is conductive, functions as an electrode. As described above, since the piezoelectric vibrator 120B does not include the electrode 221, which is included in the piezoelectric vibrator 120A, the vibration arm 210 can be made to be thin in comparison with the piezoelectric vibrator 120A. Likewise, in other configurations to be explained below, an electrode may not be provided between a silicon layer and a piezoelectric layer. Because performance of a metal electrode as a conductor is higher than that of a silicon layer, it is preferable to provide a metal electrode between a silicon layer and a piezoelectric layer from the standpoint of efficiency.

Figure 9:
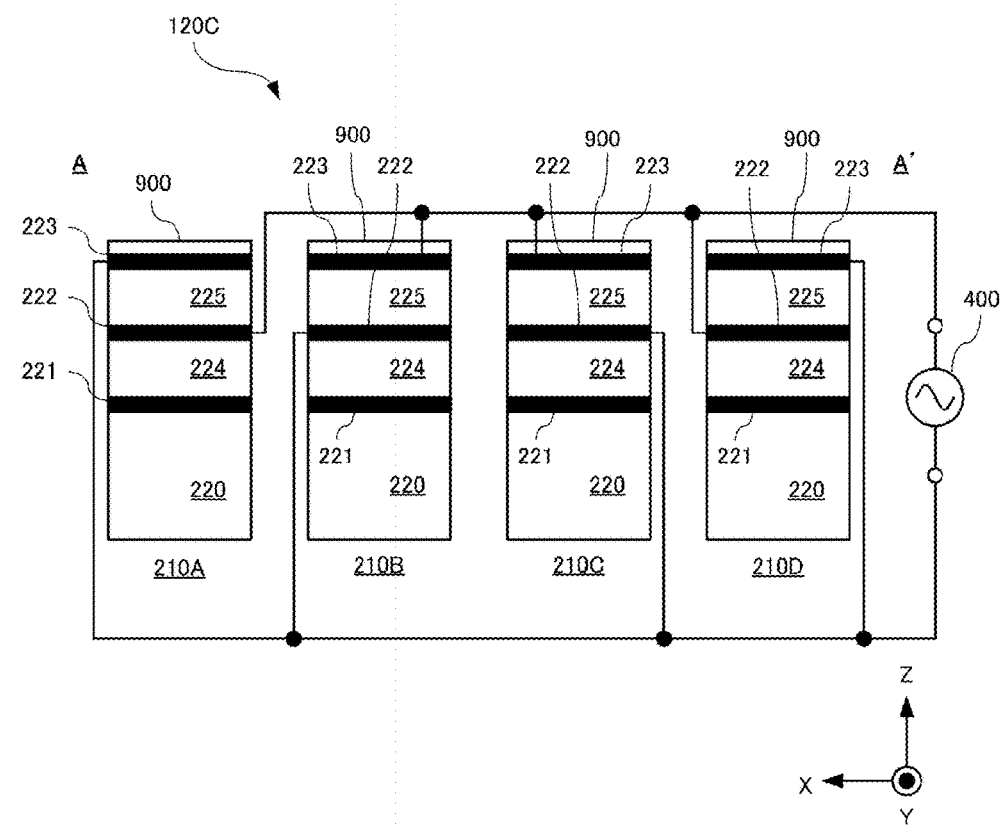
FIG. 9 is a diagram illustrating another configuration example of a piezoelectric vibrator.

FIG. 9 is a diagram illustrating another configuration example of the piezoelectric vibrator 120. It is noted that identical elements to those of the piezoelectric vibrator 120A shown in FIGS. 2 and 4 are assigned the same reference signs, and descriptions thereof will be omitted. As shown in FIG. 9, a piezoelectric vibrator 120C has the same configuration as the piezoelectric vibrator 120A except that an insulation layer 900 is disposed on the electrode 223.

The insulation layer 900 is formed with a silicon oxide (for example, $SiO_2$). A change in frequency-temperature characteristics of a silicon oxide is opposite to that of silicon within a certain temperature range. As such, by disposing the insulation layer 900 in the vibration arm 210, a change in frequency characteristics of the silicon layer 220 is cancelled out by a change in frequency characteristics of the insulation layer 900. This makes it possible to improve the frequency-temperature characteristics. Likewise, in other configurations to be explained below, providing an insulation layer on a surface-side electrode makes it possible to improve frequency-temperature characteristics.

Figure 10:
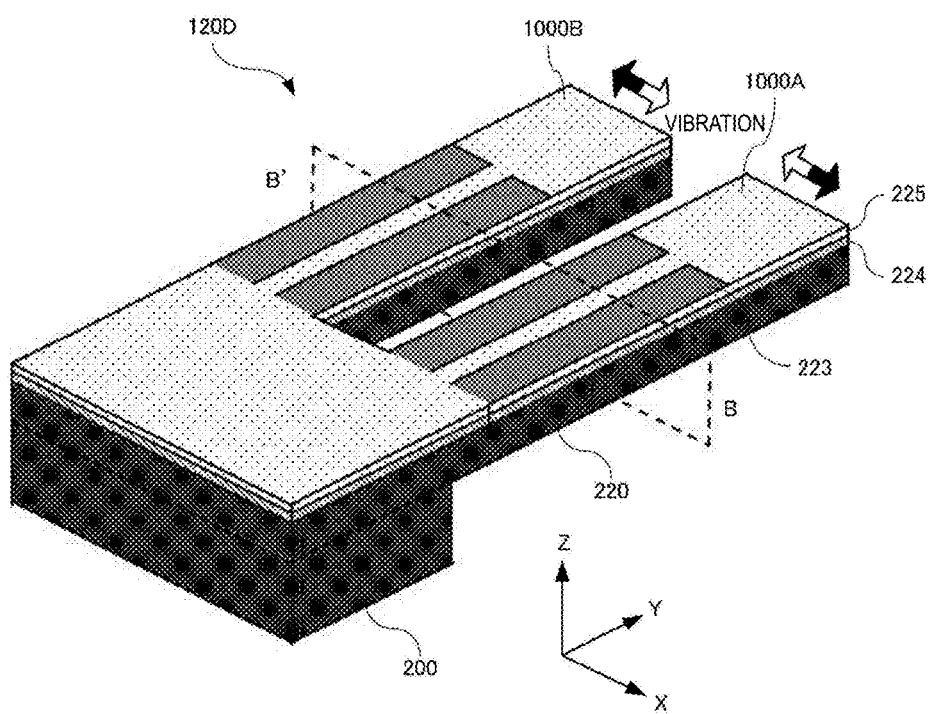
FIG. 10 is a diagram illustrating another configuration example of a piezoelectric vibrator.
Figure 11:
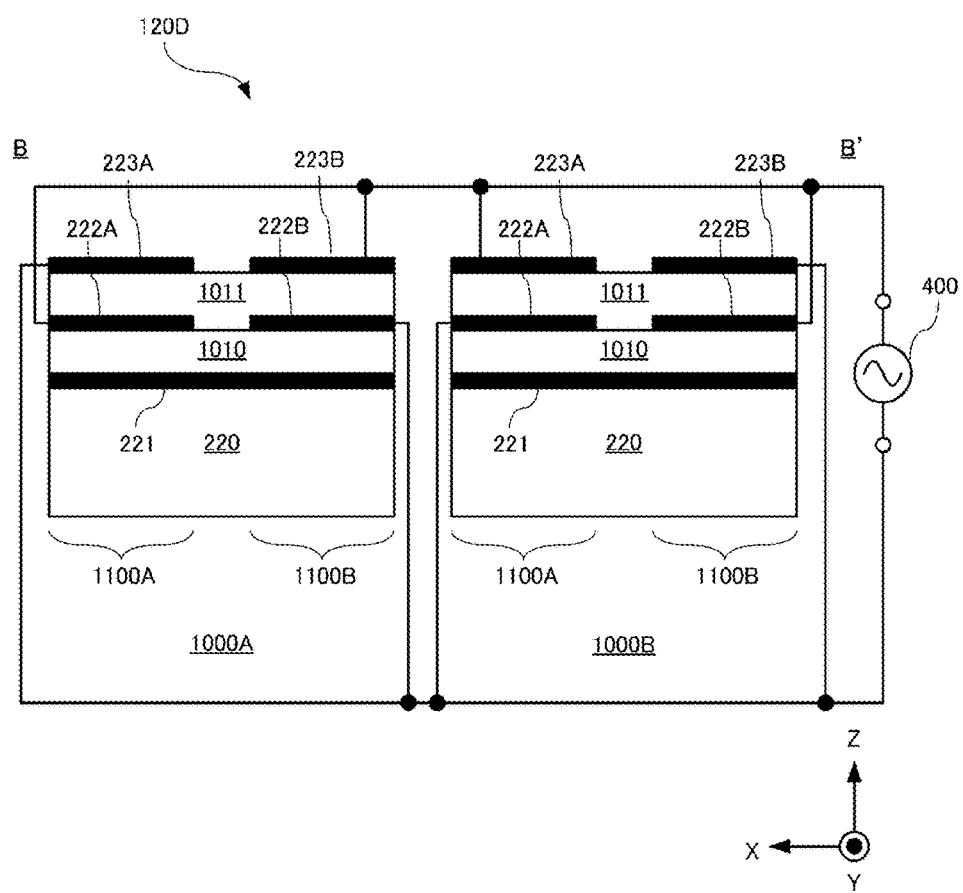
FIG. 11 is a diagram illustrating an example of electric connection in a B-B' cross section shown in FIG. 10.

FIG. 10 is a diagram illustrating another configuration example of the piezoelectric vibrator 120. It should be appreciated that identical elements to those of the piezoelectric vibrator 120A shown in FIG. 2 are assigned the same reference signs, and descriptions thereof will be omitted. As shown in FIG. 10, a piezoelectric vibrator 120D includes two vibration arms 1000A and 1000B, instead of the vibration arms 210A through 210D in the piezoelectric vibrator 120A, extending from the holding structure 200 in parallel to each other in a predetermined direction (Y axis direction in FIG. 10). As shown in FIG. 11, the vibration arm 1000A includes a vibration portion 1100A (first vibration portion) and a vibration portion 1100B (second vibration portion) that are disposed adjacent and parallel to each other. Likewise, the vibration arm 1000B also includes another vibration portion 1100A (first vibration portion) and another vibration portion 1100B (second vibration portion) that are disposed adjacent and parallel to each other. The vibration portions 1100A and 1100B of the vibration arm 1000A perform stretch-and-shrink vibration with mutually reverse phases in an extending direction of the vibration arm 1000A (Y axis direction in FIG. 10). With this, the vibration arm 1000A performs bending vibration in an in-plane direction (X axis direction in FIG. 10) of a plane including the vibration arms 1000A and 1000B (XY plane in FIG. 10). Likewise, the vibration arm 1000B also performs bending vibration in the in-plane direction (X axis direction in FIG. 10) of the plane including the vibration arms 1000A and 1000B (XY plane in FIG. 10). It is noted that the vibration arms 1000A and 1000B perform bending vibration with mutually reverse phases in the in-plane direction (X axis direction in FIG. 10) of the plane including the vibration arms 1000A and 1000B (XY plane in FIG. 10).

FIG. 11 is a diagram illustrating an example of electric connection in a B-B' cross section shown in FIG. 10. It is noted that identical elements to those of the piezoelectric vibrator 120A shown in FIG. 4 are assigned the same reference signs, and descriptions thereof will be omitted. With reference to FIGS. 10 and 11, an example of the configuration of vibration arms 1000 will be described. The vibration arms 1000 each include the silicon layer 220, the electrode 221, electrodes 222A, 222B, 223A, and 223B, and piezoelectric layers 1010 and 1011.

Similar to the piezoelectric layer 224 in the piezoelectric vibrator 120A, the piezoelectric layer 1010 is a piezoelectric thin film to convert an applied voltage to vibrations. In the piezoelectric layer 1010, the vibration portion 1100A on one side thereof (a positive direction side of the X axis in FIG. 11) (first vibration portion) and the vibration portion 1100B on the other side thereof (a negative direction side of the X axis in FIG. 11) (second vibration portion) expand/contract in accordance with a voltage between the electrodes 221 and 222 in opposite directions to each other in an in-plane direction (Y axis direction) of a plane including the vibration arms 1000A and 1000B (XY plane). With the expansion/contraction of the piezoelectric layers 1010, the vibration arms 1000A and 1000B exhibit bending displacement within the XY plane.

The piezoelectric layer 1011 has the same configuration as the piezoelectric layer 1010 except that its polarization direction is opposite to that of the piezoelectric layer 1010.

The electrodes 222A and 223A are so disposed as to sandwich the piezoelectric layer 1011 therebetween in the vibration portion 1100A on one side of the vibration arm 1000A. The electrodes 222B and the 223B are so disposed as to sandwich the piezoelectric layer 1011 therebetween in the vibration portion 1100B on the other side of the vibration arm 1000A. When potentials are applied to the electrodes 222A, 223A, 222B, and 223B through the wiring as shown in FIG. 11, in the piezoelectric layer 1011, the direction of an electric field applied to the vibration portion 1100A on one side of the piezoelectric layer 1011 is opposite to the direction of an electric field applied to the vibration portion 1100B on the other side of the piezoelectric layer 1011.

Since the electrode 221 has the same potential within the vibration arm 1000A, in the piezoelectric layer 1010, the direction of an electric field applied to the vibration portion 1100A on the one side of the piezoelectric layer 1010 is also opposite to the direction of an electric field applied to the vibration portion 1100B on the other side of the piezoelectric layer 1010.

Further, in the vibration arm 1000A, the polarization directions of the piezoelectric layers 1010 and 1011 are opposite to each other, and the direction of an electric field applied to the piezoelectric layer 1010 is opposite to the direction of an electric field applied to the piezoelectric layer 1011.

This makes the piezoelectric layers 1010 and 1011 take the same displacement direction, whereby the vibration arm 1000A vibrates in a right-and-left direction (X axis direction) as shown in FIG. 11 in accordance with the AC power supply 400. The same can be applied to the vibration arm 1000B. However, because the electric field direction in the vibration arm 1000A and the electric field direction in the vibration arm 1000B are opposite to each other, the vibration arms 1000A and 1000B vibrate with mutually reverse phases.

Similar to the piezoelectric vibrator 120A, in the piezoelectric vibrator 120D as discussed above, the electrostatic capacity can be large in comparison with the configurations of a typical parallel connection and a typical series connection, discussed above. Further, in the piezoelectric vibrator 120D, because the electrodes 221 of the vibration arms 1000 are at the same potential (floating potential), it is unnecessary to provide an insulation layer between the silicon layer 220 and the electrode 221. Accordingly, no stray capacitance will be generated between the silicon layer 220 and the electrode 221. This makes it possible to make the electrostatic capacity relatively large in comparison with the typical configurations and suppress the influence of stray capacitance.

Figure 12:
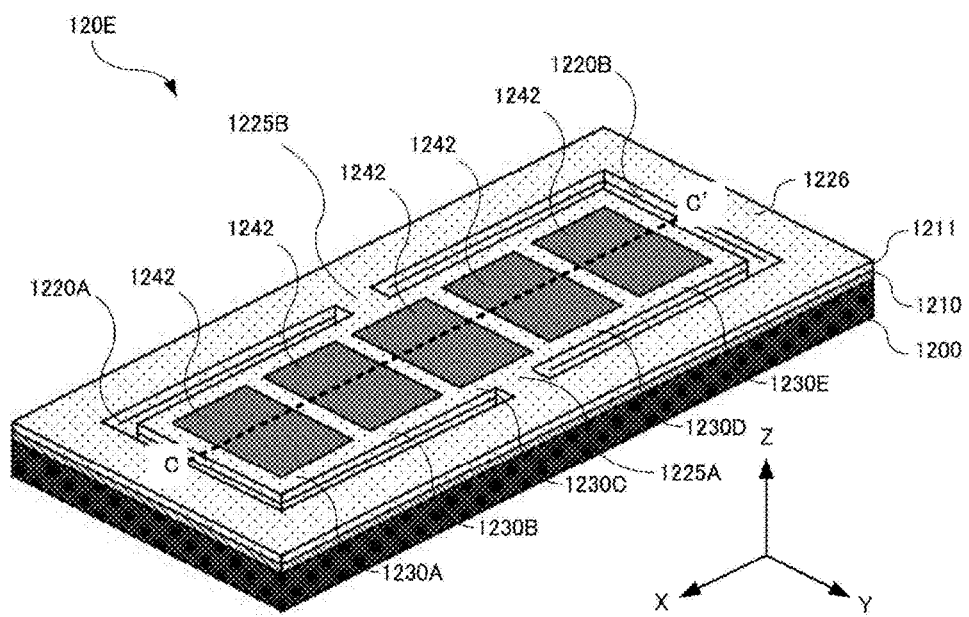
FIG. 12 is a diagram illustrating another configuration example of a piezoelectric vibrator.

FIG. 12 is a diagram illustrating another configuration example of the piezoelectric vibrator 120. As shown in FIG. 12, a piezoelectric vibrator 120E has a structure in which a silicon layer 1200 and piezoelectric layers 1210, 1211 are laminated. Further, in the piezoelectric vibrator 120E, penetration portions 1220A and 1220B, which are cavities according to an exemplary embodiment and are substantially square shaped, penetrate the piezoelectric vibrator 120E from the front surface to the rear surface are formed. The shape of the penetration portion is not limited to a substantially square shape with one side open, and can be an arbitrary shape as needed such as a substantially U shape or the like, for example. A region enclosed by the penetration portions 1220A and 1220B has five vibration portions or members 1230A through 1230E, which are connected to an outer circumference or frame 1226 through connection portions 1225A and 1225B. The number of vibration portions is not limited to five, and can be an arbitrary number as needed.

The five vibration portions 1230A through 1230E are disposed adjacent to each other in a predetermined direction (X axis direction in FIG. 12). The five vibration portions 1230A through 1230E are integrally formed while sharing the silicon layer 1200 as well as the piezoelectric layers 1210 and 1211. Each of vibration portions 1230 performs stretch-and-shrink vibration in an alignment direction of the vibration portions 1230A through 1230E (X axis direction in FIG. 12). In the piezoelectric vibrator 120E, the vibration portions 1230A through 1230E perform stretch-and-shrink vibration as a whole by two adjacent vibration portions 1230 (first and second vibration portions) vibrating with mutually reverse phases.

Figures 13, 14:
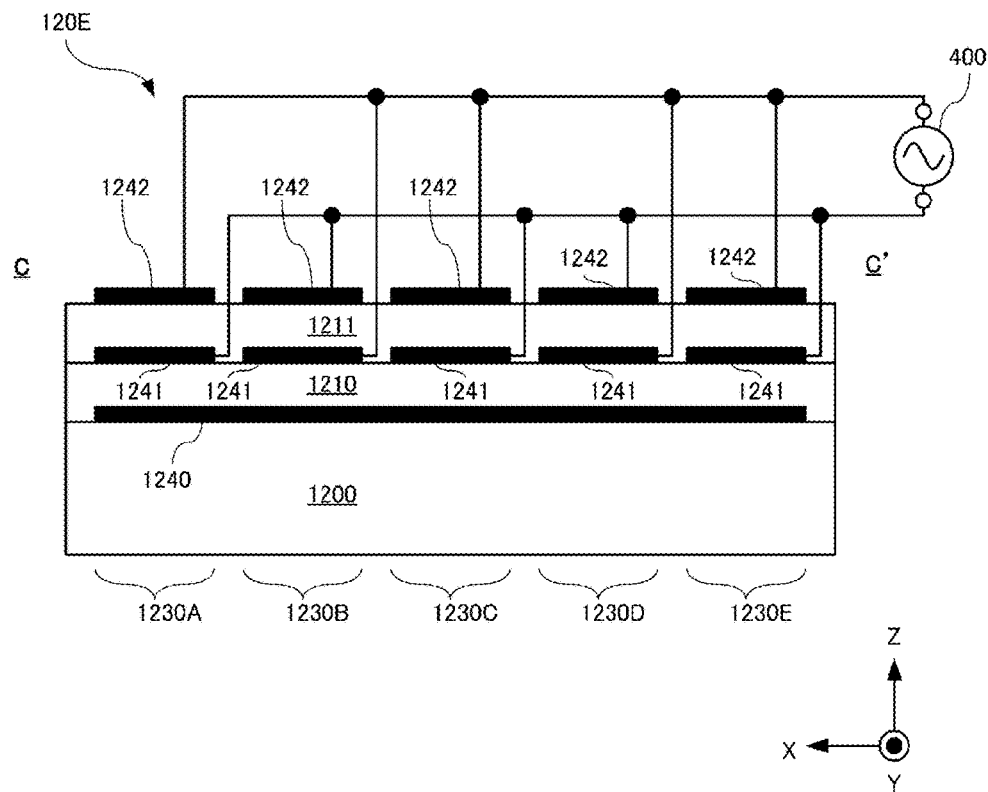
FIG. 13 is a diagram illustrating an example of electric connection in a C-C' cross section shown in FIG. 12.
FIG. 14 is a simulation result indicating characteristics of a piezoelectric vibrator.

FIG. 13 is a diagram illustrating an example of electric connection in a C-C' cross section shown in FIG. 12. With reference to FIGS. 12 and 13, an example of the configuration of the vibration portions 1230 will be described hereinafter. Each of the vibration portions 1230 includes the silicon layer 1200, the piezoelectric layers 1210 and 1211, and electrodes 1240 through 1242.

The silicon layer 1200 is the same as the silicon layer 220 of the piezoelectric vibrator 120A. The electrodes 1240 through 1242 are metal electrodes and formed preferably with molybdenum, for example. The electrode 1241 (first electrode) and the electrode 1242 (second electrode) are electrically connected to the AC power supply 400 provided outside the piezoelectric vibrator 120E. As shown in FIG. 12, the electrodes 1242 are each formed in a rectangular shape, for example, and disposed in a straight line in the alignment direction of the vibration portions 1230A through 1230E (X axis direction in FIG. 12). The electrodes 1241 have the same shape as the electrodes 1242, and disposed in a straight line at positions opposing the electrodes 1242. The electrode 1240 (third electrode) is a floating electrode, to which a potential is not applied.

Similar to the piezoelectric layer 224 in the piezoelectric vibrator 120A, the piezoelectric layer 1210 (first piezoelectric layer) is a piezoelectric thin film to convert an applied voltage to vibrations. The piezoelectric layer 1210 is displaced (expanded/contracted) in accordance with a voltage between the electrodes 1240 and 1241 in the alignment direction of the vibration portions 1230A through 1230E (X axis direction in FIG. 13).

The piezoelectric layer 1211 (second piezoelectric layer) has the same configuration as the piezoelectric layer 1210 except that its polarization direction is opposite to that of the piezoelectric layer 1210.

The electrodes 1240 through 1242 are electrically connected to the AC power supply 400 so that the direction of an electric field applied to the piezoelectric layer 1210 and the direction of an electric field applied to the piezoelectric layer 1211 are opposite to each other in each vibration portion 1230. Further, the electrodes 1240 through 1242 are electrically connected to the AC power supply 400 so that the electric field directions between two adjacent vibration portions 1230 are opposite to each other.

With this, in the piezoelectric vibrator 120E, two adjacent vibration portions 1230 perform stretch-and-shrink vibration with mutually reverse phases in the alignment direction (X axis direction in FIG. 13). As such, the overall piezoelectric vibrator 120E performs stretch-and-shrink vibration in the alignment direction of the vibration portions 1230A through 1230E (X axis direction in FIG. 13).

Similar to piezoelectric vibrator 120A, in the piezoelectric vibrator 120E as discussed above, the electrostatic capacity can be made large in comparison with the configurations of a typical parallel connection and a typical series connection. Further, in the piezoelectric vibrator 120E, because the electrode 1240 of each vibration portion 1230 is at the same potential (floating potential), it is unnecessary to provide an insulation layer between the silicon layer 1200 and the electrode 1240. Accordingly, no stray capacitance will be generated between the silicon layer 1200 and the electrode 1240. This makes it possible to make the electrostatic capacity relatively large and suppress the influence of stray capacitance in comparison with the typical configurations.

FIG. 14 is a simulation result indicating characteristics of a piezoelectric vibrator. In FIG. 14, items specified by "present embodiment" indicate characteristics of the piezoelectric vibrator 120E. Further, in FIG. 14, items specified by "parallel connection" indicate characteristics of a piezoelectric vibrator adopting a typical parallel connection. Furthermore, in FIG. 14, items specified by "series connection" indicate characteristics of a piezoelectric vibrator adopting a typical series connection.

As shown in FIG. 14, in the piezoelectric vibrator 120E, electrostatic capacity C0 has a larger value than the typical configurations. Further, in the piezoelectric vibrator 120E, "$k^2Q$" representing likelihood of vibration also has a larger value than the typical configurations. That is to say, it can also be understood from the simulation result that the piezoelectric vibrator 120E has more preferable characteristics than the typical configurations.

The present embodiment has been discussed thus far. According to the present embodiment, in the case where the first piezoelectric layers disposed on the silicon layer are connected in series and the second piezoelectric layers disposed on the first piezoelectric layers are connected in parallel, the electrostatic capacity can be made large and the influence of stray capacitance can be suppressed in comparison with the configurations of a typical parallel connection and a typical series connection.

Further, according to the present embodiment, by providing an electrode between the silicon layer and the first piezoelectric layer, efficiency can be improved in comparison with a case where the silicon layer is used as a substitute for the electrode.

Furthermore, according to the present embodiment, by providing an insulation layer formed with a silicon oxide on the electrode which has been disposed on the second piezoelectric layer, the change in frequency-temperature characteristics of the silicon layer is cancelled out. This makes it possible to improve the frequency-temperature characteristics.

It should be appreciated that the present disclosure is given to facilitate understanding of the present invention, and is not intended to limit interpretation of the present invention in any way. The present invention can be modified/improved without departing from the spirit and scope of the invention, and equivalents thereof are also included in the present invention.

Figure 15:
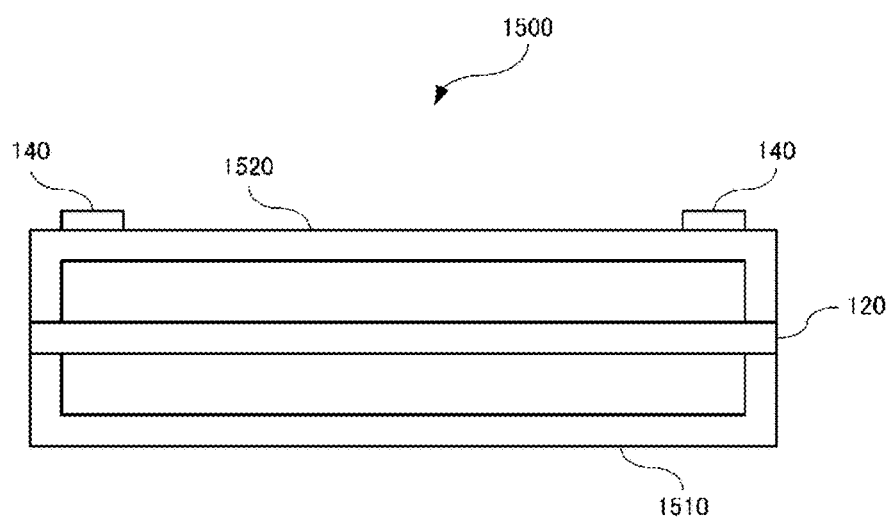
FIG. 15 is a diagram illustrating another example of a schematic structure of a piezoelectric vibration device.

For example, a piezoelectric vibration device including a piezoelectric vibrator is not limited to the configuration shown in FIG. 1, and can employ a variation of the configuration as needed. To be specific, for example, a piezoelectric vibration device can be configured as shown in FIG. 15. In an example shown in FIG. 15, a piezoelectric vibration device 1500 can be configured as a piezoelectric vibration device of a chip size package (CSP) type in which the piezoelectric vibrator 120 is sandwiched between a handle layer 1510 and a cap layer 1520 of silicon. The outer electrode 140 can be provided on the outside of the cap layer 1520, for example.

Figure 16:
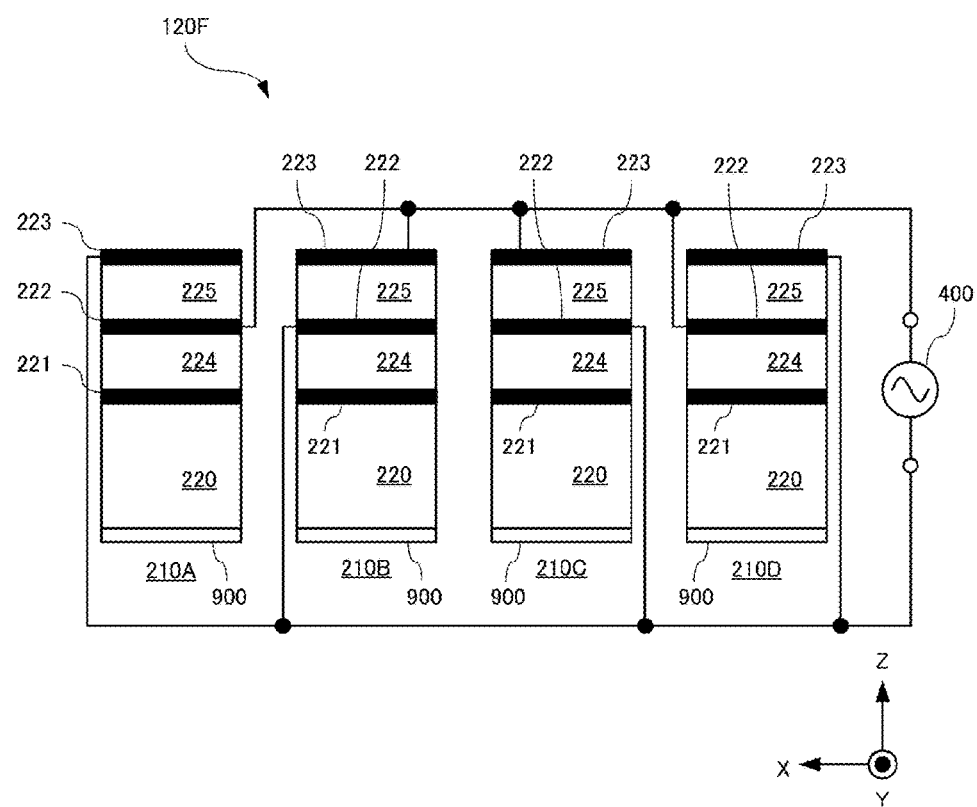
FIG. 16 is a diagram illustrating another configuration example of a piezoelectric vibrator.
Figure 17:
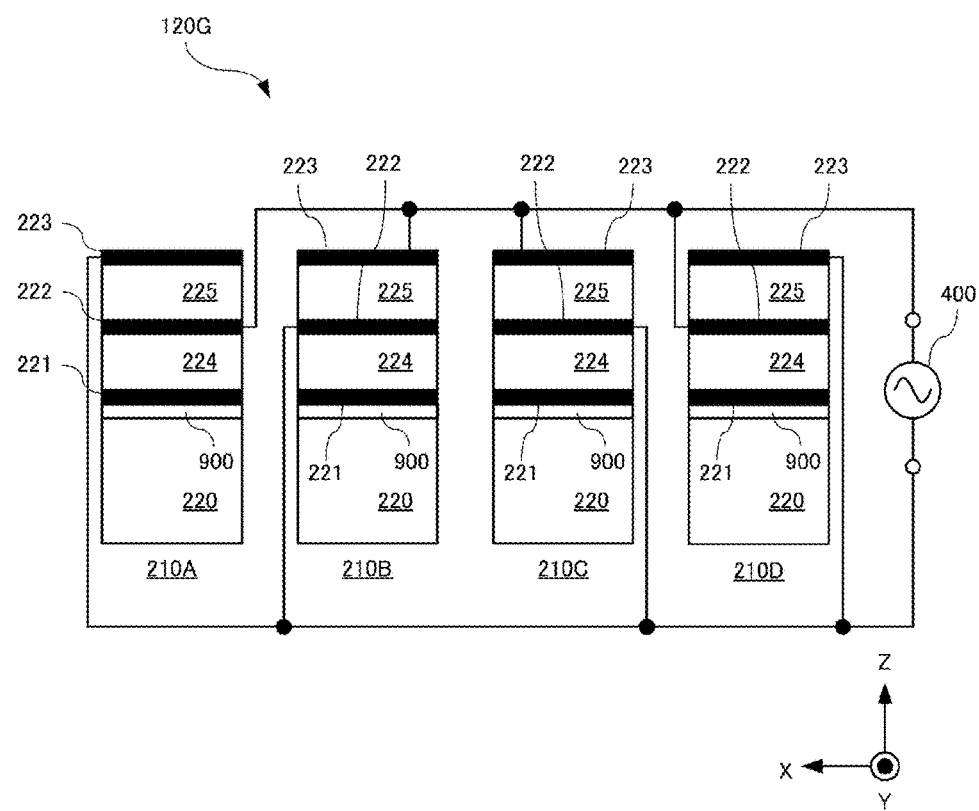
FIG. 17 is a diagram illustrating another configuration example of a piezoelectric vibrator.

Further, the insulation layer 900 for improving the frequency-temperature characteristics is not limited to the position indicated in FIG. 9, and can be disposed at an arbitrary position as needed in the vibration portion, for example. Specifically, the insulation layer 900 can be disposed as shown in FIG. 16, for example. In a piezoelectric vibrator 120F shown in FIG. 16, the insulation layer 900 is disposed under the silicon layer 220. Furthermore, the insulation layer 900 can be disposed as shown in FIG. 17, for example. In a piezoelectric vibrator 120G shown in FIG. 17, the insulation layer 900 is disposed between the silicon layer 220 and the electrode 221. Note that in a configuration for bending vibration, it is preferable for the insulation layer 900 to be provided in the outermost portion of the vibration portion as shown in FIG. 9 or FIG. 16.

REFERENCE SIGNS LIST

100 PIEZOELECTRIC VIBRATION DEVICE
110 SUBSTRATE
120 PIEZOELECTRIC VIBRATOR
130 COVER
140 OUTER ELECTRODE
200 HOLDING STRUCTURE
210, 1000, 1812, 1813 VIBRATION ARM
220, 1200, 1810 SILICON LAYER
221-223, 1240-1242, 1820, 1821 ELECTRODE
224, 225, 1010, 1011, 1210, 1211 PIEZOELECTRIC LAYER
400 AC POWER SUPPLY
900, 1811 INSULATION LAYER
1220 PENETRATION PORTION
1225 CONNECTION PORTION
1226 OUTER CIRCUMFERENCE FRAME
1230 VIBRATION PORTION

The invention claimed is:

1. A piezoelectric vibrator comprising:
a first vibration member; and
a second vibration member that vibrates with a mutually reverse phase to the first vibration member,
wherein each of the first and second vibration members includes:
a silicon layer,
a first piezoelectric layer disposed above the silicon layer,
a first electrode disposed on the first piezoelectric layer on a side opposite the silicon layer,
a second piezoelectric layer disposed on the first electrode on a side opposite the first piezoelectric layer and having polarization in an opposite direction to a direction of polarization of the first piezoelectric layer, and
a second electrode disposed on the second piezoelectric layer on a side opposite the first electrode,
wherein the first electrode of the first vibration member and the second electrode of the second vibration member are electrically connected to each other such that a first potential can be applied thereto, and
wherein the second electrode of the first vibration member and the first electrode of the second vibration member are electrically connected to each other such that a second potential can be applied thereto.

2. The piezoelectric vibrator according to claim 1, further comprising:
a holding structure comprising silicon,
wherein the first vibration member comprises a first rectangular vibration arm extending from the holding structure, and
the second vibration member comprises a second rectangular vibration arm extending from the holding structure in parallel to the first rectangular vibration arm.

3. The piezoelectric vibrator according to claim 2, wherein the first and second vibration arms are configured to vibrate with mutually reverse phases in a vertical direction relative to a plane of a direction in which the first and second vibration arms extend.

4. The piezoelectric vibrator according to claim 1, further comprising:
a holding structure comprising silicon,
wherein the first and second vibration members comprise rectangular vibration arms adjacent to each other and extending from the holding structure in parallel to each other.

5. The piezoelectric vibrator according to claim 4, wherein the vibration arms are configured to vibrate in an in-plane direction of a plane parallel to a principal surface of the first and second vibration members.

6. The piezoelectric vibrator according to claim 5, wherein the first and second vibration arms are configured to vibrate with mutually reverse phases in the in-plane direction of the plane parallel to the principal surface of the first and second vibration members.

7. The piezoelectric vibrator according to claim 1, wherein the first and second vibration members are disposed adjacent to each other and extend in a first direction, and the first and second vibration members are configured to vibrate with mutually reverse phases in the first direction.

8. The piezoelectric vibrator according to claim 1, wherein each of the first and second vibration members further includes a third electrode disposed between the silicon layer and the first piezoelectric layer.

9. The piezoelectric vibrator according to claim 8, wherein the third electrode of the first vibration member and the third electrode of the second vibration member have a same potential.

10. The piezoelectric vibrator according to claim 9, wherein the third electrode is a floating electrode.

11. The piezoelectric vibrator according to claim 1, wherein each of the first and second vibration members further includes an insulation layer comprising a silicon oxide.

12. A piezoelectric vibration device comprising:
the piezoelectric vibrator according to claim 1;
a cover that covers the piezoelectric vibrator; and
an outer electrode disposed on an outside of the cover.

13. The piezoelectric vibrator according to claim 1, further comprising:
a holding structure comprising silicon,
wherein the first vibration member comprises a pair of first rectangular vibration arms extending from the holding structure, and
the second vibration member comprises at least one second rectangular vibration arm extending from the holding structure in parallel to the first rectangular vibration arm and between the pair of first vibration arms.

14. The piezoelectric vibrator according to claim 13, wherein the pair of first vibration arms and the at least one second vibration arm are configured to vibrate with mutually reverse phases with respect to each other.

15. The piezoelectric vibrator according to claim 1, further comprising:
an outer frame; and
a pair of connecting arms configure to hold the first and second vibration members within the frame.

16. The piezoelectric vibrator according to claim 15,
wherein the first vibration member comprises at least three first vibration portions, with the first electrode of each first vibration portion electrically coupled to each other, and
wherein the second vibration member comprises at least a pair of second vibration portions interposed between the at least three first vibration portions, respectively, with the first electrode of each second vibration portion electrically coupled to each other.

17. A piezoelectric vibrator comprising:
a holding structure;
a pair of first vibration arms extending from the holding structure; and
at least one second vibration arm extending from the holding structure in parallel to the first rectangular vibration arm and between the pair of first vibration arms, the at least one second vibration arm configured to vibrate with a mutually reverse phase to the pair of first vibration arms,
wherein each of the first and second vibration arms includes:
  a silicon layer,
  a first piezoelectric layer disposed above the silicon layer,
  a first electrode disposed on the first piezoelectric layer on a side opposite the silicon layer,
  a second piezoelectric layer disposed on the first electrode on a side opposite the first piezoelectric layer and having polarization in an opposite direction to a direction of polarization of the first piezoelectric layer, and
  a second electrode disposed on the second piezoelectric layer on a side opposite the first electrode,
wherein the first electrode of each of the pair of first vibration arms and the second electrode of the at least one second vibration arm are electrically connected to each, and
wherein the second electrode of each of the first vibration arms and the first electrode of the at least one second vibration arm are electrically connected to each other.

18. The piezoelectric vibrator according to claim 17, wherein the pair of first vibration arms and the at least one second vibration arm are configured to vibrate with mutually reverse phases in a vertical direction relative to a plane of a direction in which the vibration arms extend.

19. The piezoelectric vibrator according to claim 18, wherein each of the pair of first vibration arms and the at least one second vibration arm further includes a third electrode disposed between the silicon layer and the first piezoelectric layer, the third electrode being a floating electrode.

20. The piezoelectric vibrator according to claim 18, wherein each of the pair of first vibration arms and the at least one second vibration arm further includes an insulation layer comprising a silicon oxide.

* * * * *